United States Patent [19]
Mu

[11] Patent Number: 5,615,161
[45] Date of Patent: Mar. 25, 1997

[54] CLOCKED SENSE AMPLIFIER WITH POSITIVE SOURCE FEEDBACK

[75] Inventor: Albert Mu, Milpitas, Calif.

[73] Assignee: HaL Computer Systems, Inc., Campbell, Calif.

[21] Appl. No.: 603,882

[22] Filed: Feb. 22, 1996

[51] Int. Cl.⁶ ........................................... G11C 7/00
[52] U.S. Cl. .................. 365/208; 365/205; 365/189.05; 327/57
[58] Field of Search ..................................... 365/205, 207, 365/208, 203, 189.05; 327/54, 55, 57

[56] References Cited

U.S. PATENT DOCUMENTS

| | | | |
|---|---|---|---|
| 5,491,667 | 2/1996 | Sharp | 365/205 |
| 5,502,680 | 3/1996 | Du | 365/205 |
| 5,508,644 | 4/1996 | Branson | 327/57 |

*Primary Examiner*—David C. Nelms
*Assistant Examiner*—Son Mai
*Attorney, Agent, or Firm*—Albert C. Smith

[57] ABSTRACT

A differential sense amplifier includes positive feedback cross coupling to control operation in one mode as a differential sense amplifier and in another mode as a latch to control a data-latching load. Circuit nodes are precharged and equalized in response to applied enable signal.

3 Claims, 2 Drawing Sheets

CLOCKED SENSE AMPLIFIER WITH POSITIVE SOURCE FEEDBACK

CROSS-REFERENCES TO RELATED APPLICATIONS

The subject matter of this application is related to the subject matter of the following applications:

application serial number 08/605,677, attorney docket number 2268, entitled "ASYNCHRONOUS PACKET SWITCHING" filed on Feb. 22, 1996, by Thomas M. Wicki, Patrick J. Helland, Takeshi Shimizu, Wolf-Dietrich Weber, and Winfried W. Wilcke;

application serial number 08/605,676, attorney docket number 2269, entitled "SYSTEM AND METHOD FOR DYNAMIC NETWORK TOPOLOGY EXPLORATION" filed on Feb. 22, 1996, by Thomas M. Wicki, Patrick J. Helland, Wolf-Dietrich Weber, and Winfried W. Wilcke;

application serial number 08/603,926, attorney docket number 2270, entitled "LOW LATENCY, HIGH CLOCK FREQUENCY PLESIOASYNCHRONOUS PACKET-BASED CROSSBAR SWITCHING CHIP SYSTEM AND METHOD" filed on Feb. 22, 1996, by Thomas M. Wicki, Jeffrey D. Larson, Albert Mu, and Raghu Sastry;

application serial number 08/603,880, attorney docket number 2271, entitled "METHOD AND APPARATUS FOR COORDINATING ACCESS TO AN OUTPUT OF A ROUTING DEVICE IN A PACKET SWITCHING NETWORK" filed on Feb. 22, 1996, by Jeffrey D. Larson, Albert Mu, and Thomas M. Wicki;

application serial number 08/604,920, attorney docket number 2272, entitled "CROSSBAR SWITCH AND METHOD WITH REDUCED VOLTAGE SWING AND NO INTERNAL BLOCKING DATA PATH" filed on Feb. 22, 1996, by Albert Mu and Jeffrey D. Larson;

application serial number 08/603,913, attorney docket number 2274, entitled "A FLOW CONTROL PROTOCOL SYSTEM AND METHOD" filed on Feb. 22, 1996, by Thomas M. Wicki, Patrick J. Helland, Jeffrey D. Larson, Albert Mu, and Raghu Sastry; and Richard L. Schober, Jr.;

application serial number 08/603,911, attorney docket number 2275, entitled "INTERCONNECT FAULT DETECTION AND LOCALIZATION METHOD AND APPARATUS" filed on Feb. 22, 1996, by Raghu Sastry, Jeffrey D. Larson, Albert Mu, John R. Slice, Richard L. Schober, Jr. and Thomas M. Wicki;

application serial number 08/603,923, attorney docket number 2277, entitled, "METHOD AND APPARATUS FOR DETECTION OF ERRORS IN MULTIPLE-WORD COMMUNICATIONS" filed on Feb. 22, 1996, by Thomas M. Wicki, Patrick J. Helland and Takeshi Shimizu;

all of the above applications are incorporated herein by reference in their entirety.

FIELD OF THE INVENTION

This invention relates to differential amplifiers, and more particularly to differential amplifiers with high common-mode rejection and rapid signal response.

BACKGROUND OF THE INVENTION

Computer memory circuits commonly include long interconnects with many loads distributed along the length of the interconnect. In addition, high density circuit arrangements on integrated circuit chips contribute significant noise signals that must be discriminated from desirable data signals. Accordingly, it is desirable to provide a sense amplifier for data signals that is capable of operating in high noise environment to drive large distributed loads.

SUMMARY OF THE INVENTION

The illustrated embodiment of the present invention includes a clock-latched differential amplifier circuit including field-effect transistors or other gain elements connected to provide positive feedback at the source electrodes of the differential amplifier stage. The illustrated embodiment provides rapid signal response to applied differential signals and high common-mode noise rejection, and also controls latching of data in an output stage in response to the levels of signals on the source electrodes of the differential amplifier circuit.

DETAILED DESCRIPTION OF THE PREFERRED EMBODIMENT

Figure 1:
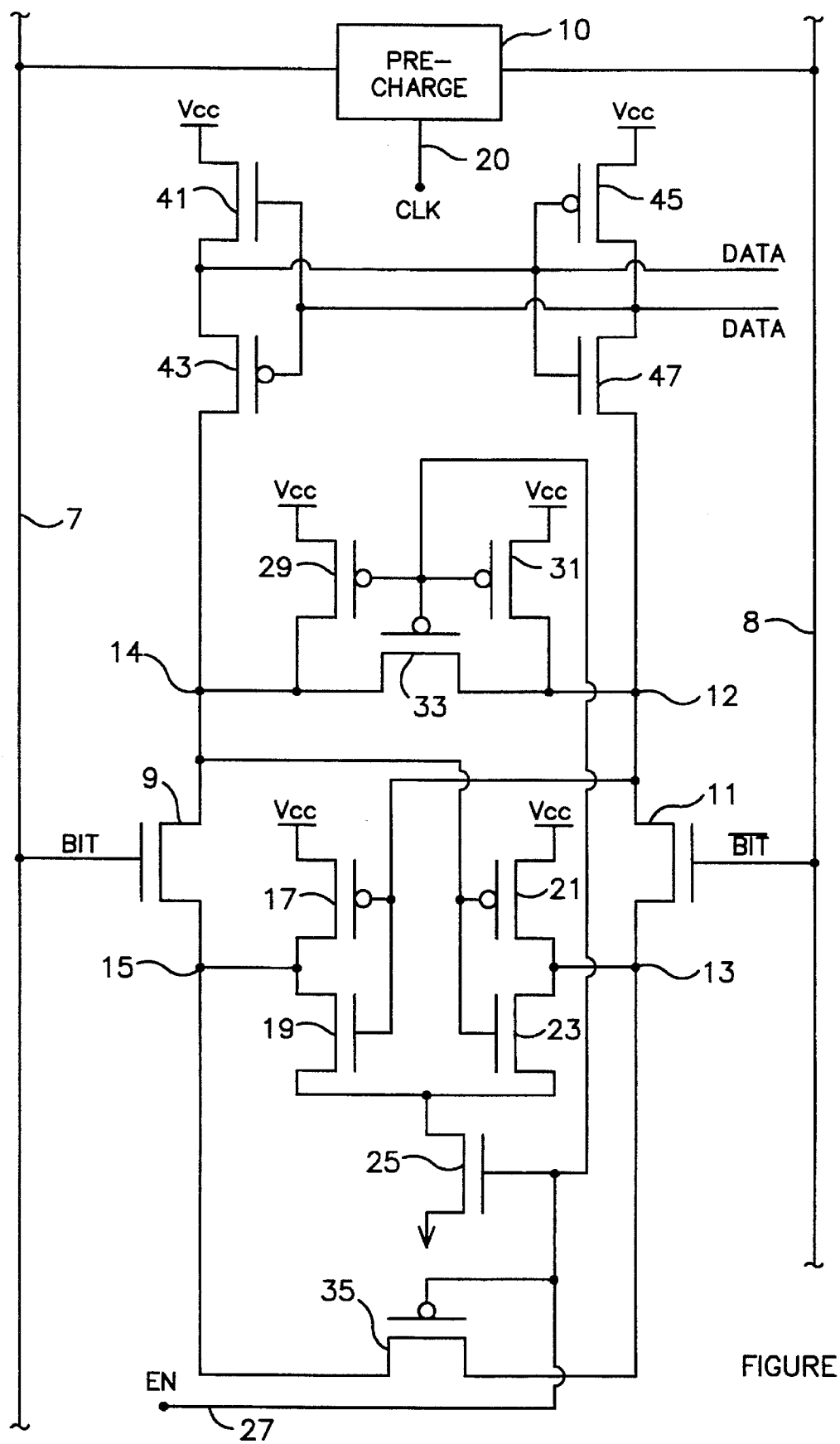
FIG. 1 is a schematic diagram of the clocked sense amplifier with positive source feedback and a latched load.

Referring now to FIG. 1, there is shown a pair of NMOS transistors 9 and 11 that have gate electrodes, or gates, connected to receive BIT and $\overline{\text{BIT}}$ input signals from long-length conductors 7, 8, and each with source and drain electrodes, or source and drain, forming the circuit nodes 12-15. Complementary pairs of CMOS transistors 17, 19 and CMOS transistors 21, 23 having opposite conduction characteristics per pair have their gates commonly connected to receive signals from cross-connected sources of the differential pair of transistors 9, 11, and also have the common connection of each of the serial pairs 17, 19 and 21, 23 connected to the circuit nodes 13, 15. This cross-coupling forms positive feedback between the transistors 9 and 11 when selectively enabled via activation to conduction of NMOS transistor 25. The amplifier circuit of NMOS transistors 9, 11 thus operates in one mode as a differential sense amplifier, and in another mode as a latch.

Initially, the sense amplifier 9, 11 functions as a conventional current-mode differential amplifier when the enable input 27 is active and NMOS transistor 25 thus acts as a current source for approximately half of the current flowing in each of the transistors 9, 11 that form the differential input pair, with excellent capability to respond to small differential input voltages on the bit lines 7, 8. In this mode, the nodes 12, 14 are initially equalized and charged to the voltage Vcc applied through PMOS transistors 29, 31, and 33 when enabled on input 27. Also, nodes 13 and 15 are equalized (but not charged to Vcc) via transistor 35 when enabled on input 27, and are also charged to a voltage substantially equal to Vcc less the threshold voltage drop of approximately 1 volt across either or both transistors 9, 11. Thus, the differential pair of transistors 9, 11 are connected and biased operate as a conventional differential amplifier while input 27 is enabled.

The BIT and $\overline{\text{BIT}}$ conductors 7, 8 may be precharged and equalized by a pre-charge circuit 10, for example, connected similarly to transistors 29, 31 and 33 operating on a clock input 20. If the BIT input discharges (and $\overline{\text{BIT}}$ remains energized), then the voltage level of node 12 drops more quickly than the voltage level at node 14 while enable input 27 is disabled. Thus, the voltage of node 14 charges up through the cross-coupled, positive-feedback via transistors 17, 19, 21 and 23, and this effectively turns off transistor 9. Therefore, all of the current flows through transistor 11 of the differential pair of transistors 9, 11 causing the voltage level on node 12 to drop more rapidly and further accelerating the switching of the differential input pair of transistors 9 and 11. Such cross-coupled positive feedback also improves noise rejection during operation in this mode as a differential sense amplifier.

With the sense amplifier thus latched by operation of the cross-coupled positive feedback provided by transistors 17, 19, 21, 23, the differential pair of input transistors 9, 11 also operates in the latch mode to control data latching in response to the voltage differences at nodes 12 and 14 while input 27 is disabled. Specifically, the data latch is formed by the complementary pairs of NMOS and PMOS transistors 41, 43 and 45, 47 that have source and drain paths serially connected (in opposite orientations) between the Vcc voltage supply and each of the nodes 12 and 14. The gates of each complementary pair of the transistors 41, 43 and 45, 47 are connected together and to the common serial junction of the other pair of transistors as the DATA and $\overline{\text{DATA}}$ signal channels. This data latch 41, 43 45, 47 thus functions in conventional manner in response to the voltage differences appearing on nodes 12 and 14 in response to differential BIT and $\overline{\text{BIT}}$ signals applied to the gates of the differential input transistors 9 and 11. The transistors 29, 31, 33 and 35 are connected as described above to equalize and precharge the nodes 12-15 in response to an ENable signal at input 27, and transistor 25 serves as a current source for the input transistors operating as a differential sense amplifier in response to the ENable signal at input 27.

Figure 2:
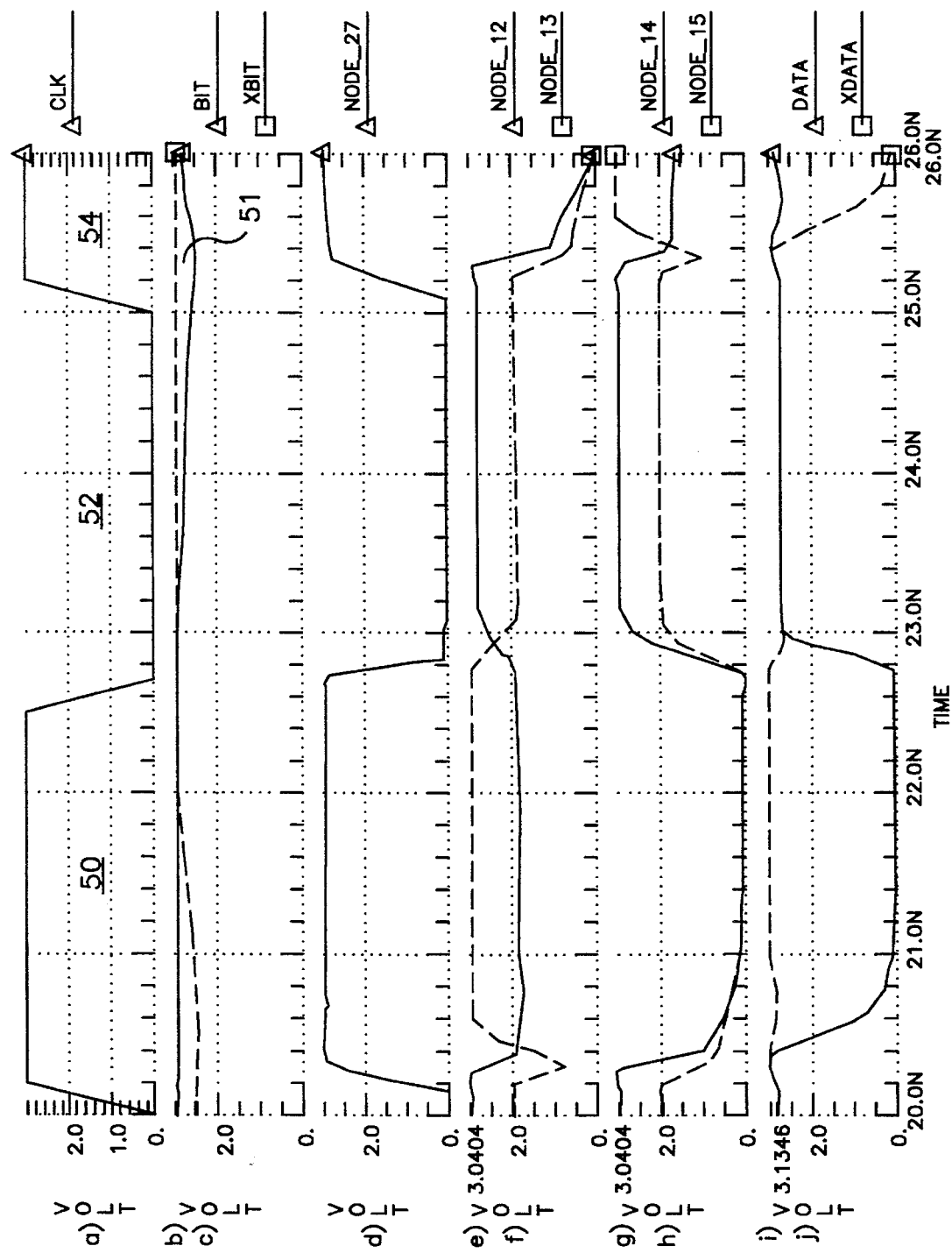
FIGS. 2a)–2j) are graphs showing signal waveforms present on circuit nodes during operation of the sense amplifier of FIG. 1.

Referring to FIGS. 2a)–2j), there is shown a chart of waveforms present over time during operation of the circuit of FIG. 1. Specifically, the operating time intervals are shown designated as previous sensing cycle and precharge 50, followed in time by BIT and $\overline{\text{BIT}}$ discharge cycle 52, followed in time in recurring manner by another sensing cycle 54. FIG. 2a represents a clock waveform 10, and FIG. 2d represents the ENable signal 27 delayed slightly from the clock signal 10 attributable, for example, to the clock waveform 10 passing through a latch with associated delay to produce the ENable signal 27. As illustrated in FIGS. 2b and 2c, the BIT and $\overline{\text{BIT}}$ conductors 7, 8 charge up to a common voltage substantially at Vcc during precharge 50, and then during the discharge cycle 52 begin to discharge at different rates to produce a potential difference at the beginning of the sense cycle 54. As ENable signal 27 of FIG. 2d goes high after the BIT and $\overline{\text{BIT}}$ discharge cycle 52, the sense amplifier 9, 11 is enabled to sense the differential voltage 51 on the BIT and $\overline{\text{BIT}}$ conductors 7, 8. It should be noted that the voltages on the circuit nodes 12 and 14 (in FIGS. 2e and 2g) are at substantially the same voltage level during the discharge cycle 52, while the voltages on the circuit nodes 13 and 15 (in FIGS. 2f and 2h) during the discharge cycle 52 are substantially equal at about the voltage Vcc less the drop of about 1 volt across one or both of the input transistors 9, 11. These input transistors are thus enabled to sense the differential voltage on BIT and $\overline{\text{BIT}}$ conductors 7, 8 (in FIGS. 2b, 2c) when the ENable signal 27 (in FIG. 2d) is again activated. Thus, the input transistors 9, 11 sense the differential input voltages on BIT and $\overline{\text{BIT}}$ conductors 7, 8, amplify the differential voltage during operation initially as a differential sense amplifier at the beginning of cycle 54, and then respond through the positive feedback provided by transistors 17, 19, 21, 23 to latch at least one transistor (e.g., transistor 11, as shown (in FIGS. 2e and 2f) with substantially common voltages on nodes 12 and 13. Voltage levels on DATA and $\overline{\text{DATA}}$ conductors (in FIGS. 2i and 2j) thus split and are latched rapidly in the sense cycle 54 (and in the successive sensing and precharge cycle, a sample of which is shown in interval 50). The amplifier circuit is reset and precharged thereafter in response to the cyclic enable and disable logic levels of the ENable signal 27, in the manner as previously described.

Therefore, the sense amplifier of the present invention operates as a conventional differential amplifier and includes positive feedback to rapidly initiate latching operation with associated excellent noise rejection.

I claim:

1. A memory data sensing circuit for operation on clocked signals with a memory cell that includes a pair of complementary bit channels, the sensing circuit comprising:

a precharging circuit connected to the pair of complementary bit channels and connected to receive a clock signal for selectively charging the pair of complementary bit channels to a logical signal level;

a pair of input gain elements each including a pair of electrodes forming an output circuit and having an input electrode connected to an associated one of the complementary bit channels;

a coupling circuit connecting the pair of input gain elements and disposed to receive an enable signal in one logic state for operation in one mode as a differential amplifier, and cross coupling the pair of input gain elements for operation in another mode on received enable signal in another logic state to provide positive feedback between the input gain elements for operation thereof as a latch;

a conditioning circuit connected to receive the enable signal and coupled to the output circuits of the input gain elements for charging the output circuits substantially to the same logic signal levels in response to said another logic state of the enable signal; and a data latch coupled to respond to the logic signal levels on the output circuits of the input gain elements to provide data signals representative of signals on the complementary bit channels.

2. The sensing circuit according to claim 1 wherein the logic states of the enable signal are indicative of different logic states of the clock signal.

3. The sensing circuit according to claim 1 wherein the input gain elements are of one conductivity type, and the coupling circuit includes for each input gain element a pair of gain elements of opposite conductivity types, each including an input electrode and a pair of electrodes forming serially-connected output circuits, with input electrodes of the pair of gain elements for one of the input gain elements commonly connected to the output circuit of the other of the pair of input gain elements, and with the serial connection of the output circuits of the gain elements for each input gain elements connected to the output circuit of the associated input gain element for providing differential signal conduction through the gain elements of the one conductivity type during operation in said one mode.

* * * * *